United States Patent
Miyagi et al.

(10) Patent No.: US 7,525,329 B2
(45) Date of Patent: Apr. 28, 2009

(54) ELECTRICAL CONNECTING APPARATUS

(75) Inventors: Yuji Miyagi, Aomori (JP); Kiyotoshi Miura, Aomori (JP); Hidehiro Kiyofuji, Aomori (JP); Akihisa Akahira, Aomori (JP); Tatsuo Inoue, Tokyo (JP)

(73) Assignee: Kabushiki Kaisha Nihon Micronics, Mushashino-shio, Tokyo (JP)

( * ) Notice: Subject to any disclaimer, the term of this patent is extended or adjusted under 35 U.S.C. 154(b) by 0 days.

(21) Appl. No.: 11/929,005

(22) Filed: Oct. 30, 2007

(65) Prior Publication Data

US 2008/0122467 A1 May 29, 2008

(30) Foreign Application Priority Data

Nov. 29, 2006 (JP) ............... 2006-321205

(51) Int. Cl.
*G01R 31/02* (2006.01)
(52) U.S. Cl. ..................................... 324/754
(58) Field of Classification Search ........... 324/754
See application file for complete search history.

(56) References Cited

U.S. PATENT DOCUMENTS 6,586,955 B2 * 7/2003 Fjelstad et al. .............. 324/754
7,285,968 B2 * 10/2007 Eldridge et al. ............. 324/754
2004/0207425 A1 * 10/2004 Ido ............................ 324/760

FOREIGN PATENT DOCUMENTS

JP 2005-17121 1/2005
WO WO 2005/106504 A1 11/2005

* cited by examiner

*Primary Examiner*—Ha Tran T Nguyen
*Assistant Examiner*—Shaun Campbell
(74) *Attorney, Agent, or Firm*—Ingrassia Fisher & Lorenz, P.C.

(57) ABSTRACT

A wiring path of a circuit board has a first vertical path portion penetrating the circuit board at its outer edge in its thickness direction and connected to a connector on one surface, a second vertical path portion penetrating the circuit board in its thickness direction and connected to the electric coupler on the other surface, and a lateral path portion connecting both vertical portions, and the second vertical path portion is formed within an arrangement area (S1) of a reinforcing plate. One connecting end portion (electric coupler side) of the wiring path of the circuit board is disposed within the arrangement area (S1) of the reinforcing plate. On the other hand, the other connecting end portion (probe side) of the wiring path of the circuit board is disposed to be dispersed in an arrangement area (S2) wider than the arrangement area (S1) of the reinforcing plate.

8 Claims, 5 Drawing Sheets

ELECTRICAL CONNECTING APPARATUS

TECHNICAL FIELD

The present invention relates to an electrical connecting apparatus such as a probe card for use in electrical connection between a device under test, e.g., an integrated circuit and a tester for conducting its electrical inspection to electrically test an electric circuit.

BACKGROUND

A conventional electrical connecting apparatus of this type comprises, for example, a printed circuit board (PCB) which is provided inside with a plurality of wiring paths, and on one surface of which a circuit board having a reinforcing plate attached and a probe board is mounted, the probe board being provided with a plurality of probes on the opposite face of the surface opposing the circuit board. Between both the boards, an electric coupler such as a pogo pin connector connecting each of the wiring path of the circuit board and each wiring path of the probe board corresponding to the wiring path are disposed, the circuit board, the electric coupler and the probe board being integrated (see, for example, Patent Document 1 and Patent Document 2).

Each of the wiring paths of the circuit board is connected to an electric circuit of a tester body through sockets aligned at an outer edge portion exposed from the reinforcing plate on the one surface of the circuit board. On the other hand, to each wiring path of the probe board is connected the corresponding probe. Thus, each probe is connected to the tester body by a socket disposed at the outer edge portion exposed from the reinforcing plate of the circuit board through the electric coupler and the wiring path of the circuit board.

Figure 5:
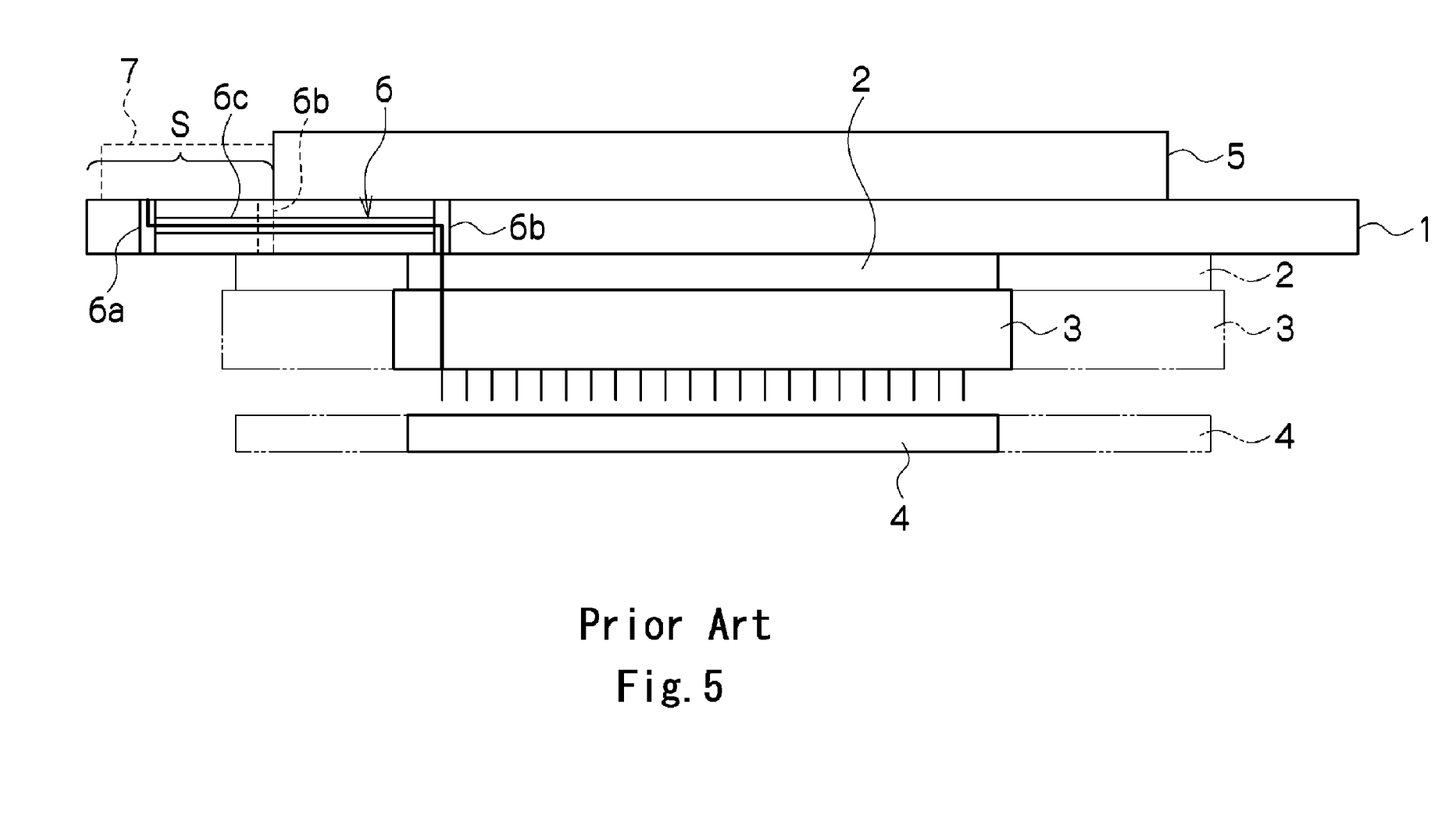
FIG. 5 is a schematic view of an electrical connecting apparatus to explain a conventional art.

As schematically shown in FIG. 5, the probe board 3 to be connected to the circuit board 1 through the electric coupler 2 is formed to conform to the size of a semiconductor wafer 4 which is a device under test. On the other hand, one having a planar shape sufficiently greater than the probe board 3 is used as the circuit board 1. Therefore, such a wiring path as mentioned above which is formed on the circuit board 1 and the probe board 3 is so formed as to converge toward a smaller probe board 3 than this one disposed in the central area of the circuit board from an outer edge portion S of a generally large circuit board 1.

Because of this convergent configuration, a wiring path 6 (one of which is typically shown) of the circuit board 1 has: a first vertical path portion 6a penetrating at the outer edge portion S of the circuit board 1 in its thickness direction and to be connected to a connector 7 on the one surface; and a second vertical path portion 6b penetrating in the thickness direction of the circuit board 1 more radially inward of the circuit board 1 than the first vertical path portion 6a; and a lateral path portion 6c connecting both vertical path portions 6a and 6b. The second vertical path portion 6b opens at the one surface where the connector 7 is provided but opens at an inner area, i.e., an arrangement area for the reinforcing plate 5, rather than the arrangement area of the connector 7, so that the connector 7 is not prevented from being disposed.

As shown by an imaginary line in FIG. 5, however, when the probe board 3 is upsized so as to enlarge the probe area of the probe board 3 in correspondence to enlargement of a semiconductor wafer 4, the second vertical path portion 6b of the wiring path 6 opens at the outer edge portion S of the circuit board 1 which is the arrangement area of the connector 7. This causes a problem of interference between the connector 7 and the end portion of the second vertical path portion 6b.

To avoid the interference between the connector 7 and the end portion of the second vertical path portion 6b, upsizing of the circuit board 1 requires remodeling of a tester head to which a probe card is attached. It is, therefore, necessitated to downsize the connector 7 in order to avoid any interference between the connector 7 and the end portion of the second vertical path portion 6b without incurring upsizing of such wring board 1.

[Patent Document 1] WIPO Publication No. 2005/106504; [Patent Document 2] Japanese Patent Appln. Public Disclosure No. 2005-17121

BRIEF SUMMARY

An object of the present invention is, therefore, to provide an electrical connecting apparatus capable of ensuring a connection area to a tester on one surface of a circuit board sufficiently even when upsizing of a probe board causes the probe area to stretch to an outward area of a reinforcing plate.

Another object of the present invention is to provide an electrical connecting apparatus adapted to upsizing of a probe board accompanying enlargement of a semiconductor wafer, without incurring any change in the size or arrangement of a connector which becomes a connecting portion to a tester.

The electrical connecting apparatus according to the present invention comprises: a circuit board inside of which wiring paths are provided, on one surface of which a reinforcing plate is provided, and on the peripheral portion exposed from the reinforcing plate of which a connector for removably connecting electric wires from the tester to the corresponding wiring paths is provided; an electric coupler disposed on the other surface of the circuit board; a probe board where a wiring path corresponding to the wiring path of the circuit board is provided; and a plurality of probes provided on the other surface of the probe board. The wiring path of the circuit board has: a first vertical path portion penetrating in the thickness direction of the circuit board at the outer edge portion thereof and connected to the connector on the one surface; a second vertical path portion penetrating in the thickness direction of the circuit board and connected to the electric coupler on the other surface; and a lateral path portion for connecting both the vertical path portions. The wiring path of the probe board is connected to the corresponding second vertical path portion of the wiring path of the circuit board through the electric coupler at one connecting end portion provided on the one surface of the probe board, and connected to the corresponding probe at the other connecting end portion provided on the other surface of the probe board. The second vertical path portion is within the corresponding area of the wiring path of the probe board, and the arrangement area of the other connecting end portion of the wiring path of the probe board is wider than that of the one connecting end portion of the wiring path of the probe board.

In the electrical connecting apparatus according to the present invention, the wiring path of the circuit board is constituted by: a first vertical path portion penetrating in the thickness direction at the outer edge of the circuit board and connected to the connector on the one surface; a second vertical portion penetrating in the thickness direction of the circuit board and connected to the electric coupler on the other surface; and a lateral path portion connecting both vertical path portions, but the second vertical path portion is formed within an arrangement area of the reinforcing plate regardless of upsizing of the probe board. Thus, the one connecting end portion of the wiring path of the probe board, that is, the connecting end portion connected to the second vertical path portion through the electric coupler is disposed within the arrangement area of the reinforcing plate. On the other hand, the other connecting end portion of the wiring path of the probe board, that is, the connecting end portions to which the probes are connected are disposed to be dispersed in a wider area than the arrangement area of the reinforcing plate.

The wiring path of the probe board is, therefore, formed in a spreading form, contrary to the convergent form, from the one connecting end portion to the other connecting end portion where the probes are connected. This spreading form enables to prevent the second vertical path portion of the circuit board from exposing in the arrangement area of the connector, even when upsizing of the probe board is intended.

According to the present invention, therefore, even when the probe area stuck out into an outward area of the reinforcing plate due to upsizing of the probe board, a connection area to the tester can be sufficiently ensured on one surface of the circuit board. Also, even by enlargement of the probe board accompanying enlargement of the semiconductor wafer, it is possible to adapt without incurring any change of the size or arrangement of the connector which becomes a connecting portion to the tester.

The reinforcing plate can generally have a circular planar shape. The circular planar-shaped reinforcing plate enables to arrange multiple connectors along its outer edge.

The electric coupler can use a pogo pin connector which has a plurality of pogo pins and a pogo pin block to accommodate the pogo pins so as to project both their ends. The pogo pin connector surely connects the second vertical path portion of the circuit board and the first connecting end portion of the corresponding probe board.

According to upsizing, for example, of the semiconductor wafer, it is possible to make the planar configuration of the probe board greater than that of the reinforcing plate. In this case, the arrangement area of the probe board is disposed to stick more outward than that of the reinforcing plate. Even in such a case, the arrangement area of the one connecting end portion of the probe board lies within an area corresponding to the arrangement area of the reinforcing plate.

The arrangement area of the other connecting end portion of the probe board can stick out toward the outward area, exceeding the arrangement area of the reinforcing plate.

An arrangement density of the one connecting end portion of the probe board in the arrangement area is higher than the arrangement density of the other connecting portion of the probe board.

The probe board can be made of a ceramic plate. In this case, inside the ceramic, there are provided: a first vertical path portion forming the connecting end to the electric coupler disposed within the arrangement area of the reinforcing plate on a surface opposing the electric coupler of the ceramic plate; a second vertical path portion forming the connecting end to the probe arranged on the other surface within the area sticking out of the arrangement area; and a lateral path portion connecting the first and the second vertical path portions.

Also, the probe board can be made of a ceramic plate inside of which an conductive path is formed; and an insulating plate adhered to the ceramic plate and provided inside with an conductive path. In this case, the conductive path of the ceramic plate has a vertical path portion disposed to expose within the arrangement area of the reinforcing plate on the surface opposing the electric coupler and penetrating in the thickness direction of the ceramic plate, and the conductive path of the insulating plate has a connecting portion provided in correspondence to the vertical path portion of the ceramic plate on one surface opposing the ceramic plate, a connecting portion disposed within an area out of the arrangement area of the reinforcing plate on the other surface of the insulating plate, and a connecting path connecting both connecting portions within the insulating plate.

DETAILED DESCRIPTION

Figure 1:
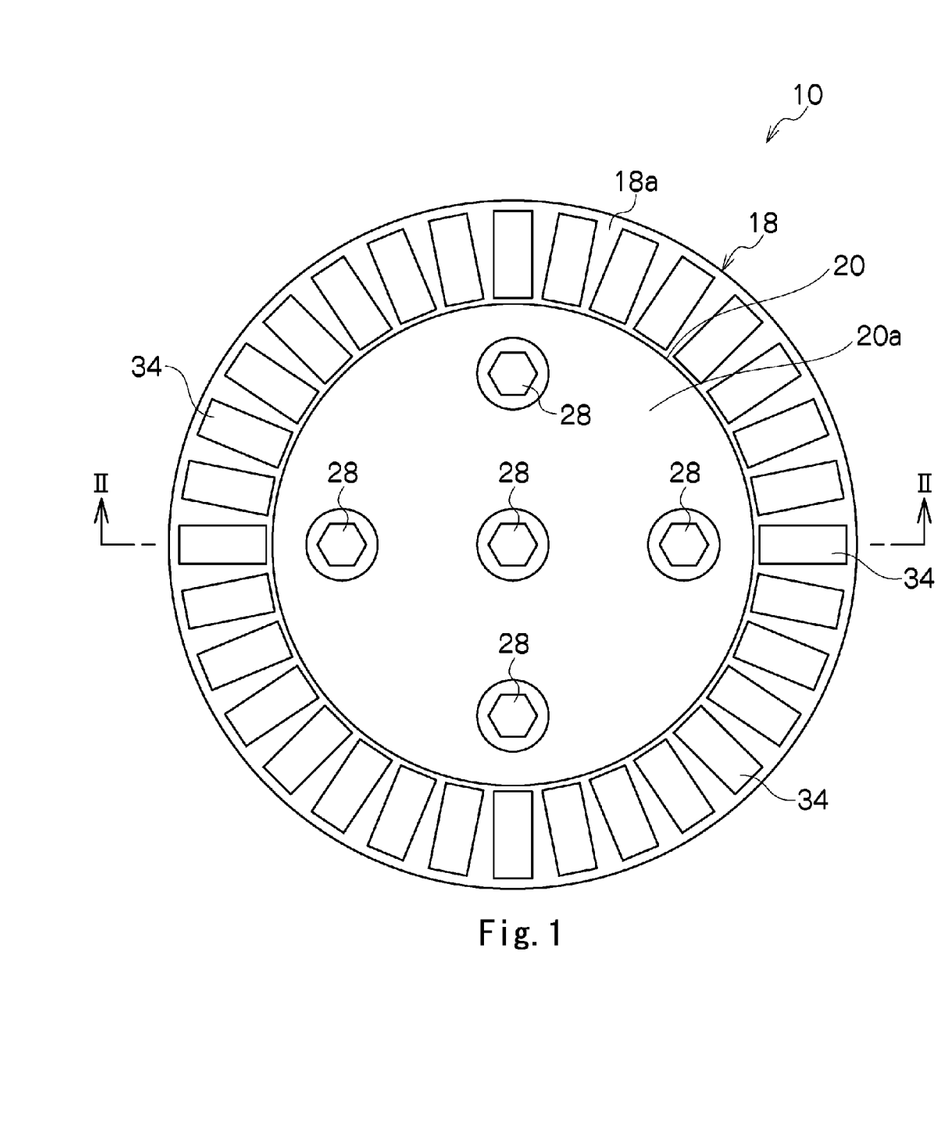
FIG. 1 is a plan view showing the electrical connecting apparatus according to the present invention.
Figure 2:
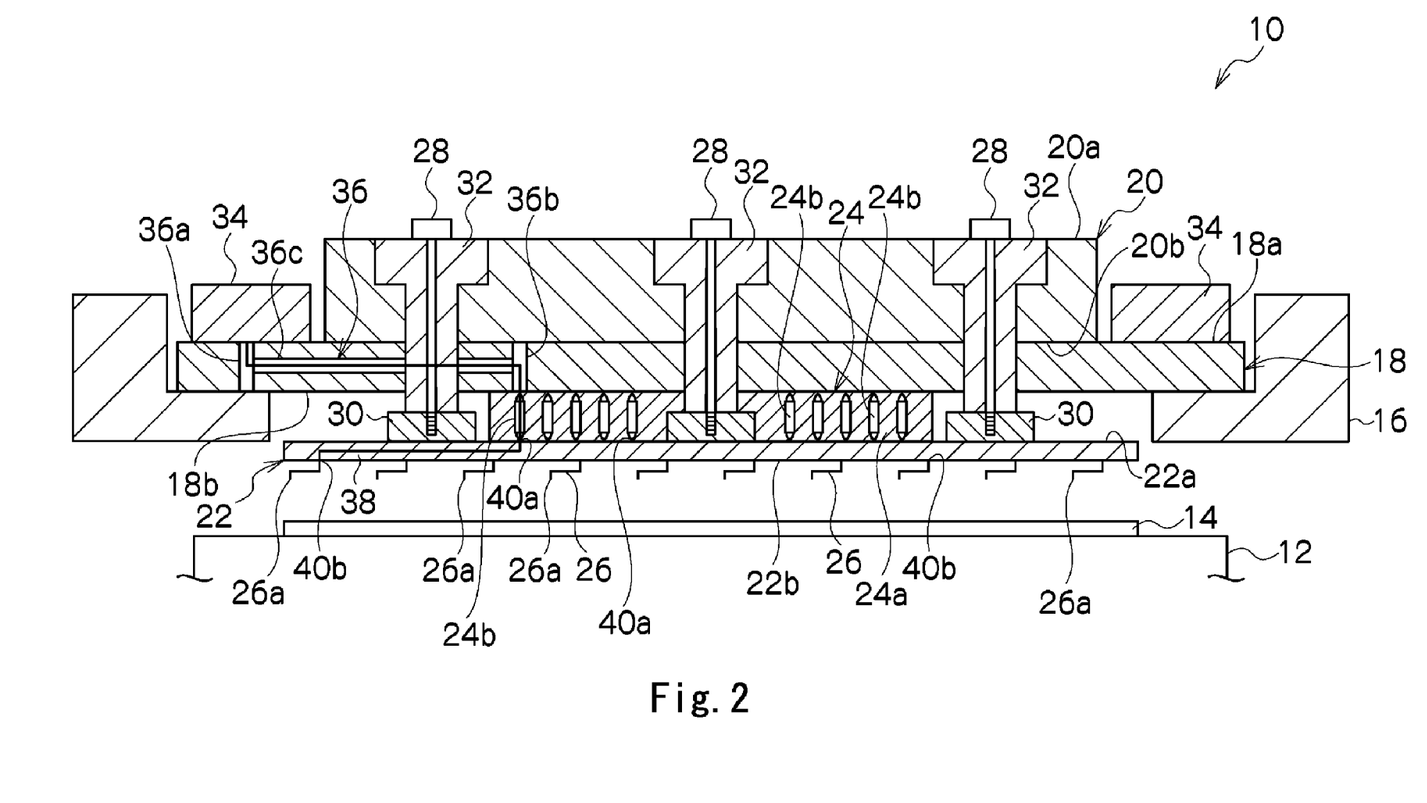
FIG. 2 is a schematic section obtained along the line II-II in FIG. 1.

The electrical connecting apparatus 10 according to the present invention is shown in FIGS. 1 and 2. This electrical connecting apparatus 10 is, as shown in FIG. 2, used, for example, for an electrical inspection of a semiconductor wafer 14 on a known vacuum chuck 12 which constitutes a sample table of a tester. In the semiconductor wafer 14, a plurality of IC circuits are incorporated, and for an electrical inspection of those IC circuits, though not shown, are used for connecting each connection pad of each IC circuit to an electric circuit of a tester body (not shown).

The electrical connecting apparatus 10 is used, attached to a tester head of the tester, for example. The electric connecting apparatus 10 comprises, as shown in FIG. 2: a circular plate-like circuit board 18 held at its edge portion on an annular card holder 16 provided in the tester head; a circular plate-like reinforcing plate 20 mounted on the upside 18a of the circuit board and having a smaller diameter than the circuit board 18; probe boards 22 arranged at intervals from the underside 18b of the circuit board 18; and an electric coupler or connector 24 disposed between the underside 18b of the circuit board 18 and the upside 22a of the probe board opposing the underside.

There are multiple probes 26 provided on the underside 22b of the probe board 22. Each probe 26 corresponds to each connecting pad provided in the IC circuit of the semiconductor wafer 14. For this probe 26, known various probes such as needle type one, blade type one or pogo pin type one are usable.

These reinforcing plate 20, circuit board 18, electric coupler 24 and probe board 22 are integrally combined with the tip 26a of the probe 26 on the probe board directed downward by a screw member 28 such as a bolt. For this combination, the screw member 28 is disposed with the reinforcing plate 20, circuit board 18 and electric coupler 24 inserted from the upside 20a of the reinforcing plate 20, and the front end portion is screwed into an anchor portion 30 formed on the upside 22a of the probe board 22. To the screw member 28 is attached a cylindrical spacer member 32 whose front end contacts the top surface. When the screw member 28 is fastened to the anchor portion 30, by the spacer function of the spacer member 32 and the anchor portion 30, the tip 26a of each probe 26 is held on an imaginary plane (not shown) parallel to the underside 20b of the reinforcing plate 20 which is a reference plane.

The circuit board 18 is formed, like a conventional circuit board, from a printed circuit board (PCB), wherein an annular edge portion of its upside 18*a* is, as shown in FIG. 1, exposed from the outer edge of the reinforcing plate 20 arranged concentrically on the circuit board 18. In this exposed edge portion, there are arranged multiple sockets 34 which form connectors to the tester.

Again referring to FIG. 2, multiple wiring paths 36 are formed on the circuit board 18. FIG. 2 shows one of them as a typical example. The wiring path 36 is provided in the annular outer edge portion including the annular area (see FIG. 1) where the sockets 34 of the circuit board 18 are arranged, with: multiple first vertical path portions 36*a* formed penetrating the circuit board 18 in the thickness direction; multiple second vertical path portions 36*b* formed penetrating the circuit board 18 in the thickness direction in a more inward area than the outer edge portion of the reinforcing plate 20, that is, within a circular area corresponding to the arrangement area of the reinforcing plate 18; and lateral path portions 36*c* extending laterally within the circuit board 18 so as to connect both vertical path portions 36*a*, 36*b*.

The upper end of the first vertical path portion 36*a* of each wiring path 36 is exposed at the upside 18*a* of the circuit board 18, and each first vertical path portion 36*a* is connected to each corresponding electrical contact point (not shown) of the corresponding socket 34. Also, while the upper end of each second vertical portion 36*b* is exposed at the upside of the circuit board 18, since the upper end is positioned under the reinforcing plate 20, it does not interfere with the socket 34 and give no influence to the arrangement of the socket 34. The lower end of the second vertical path portion 36*b* is exposed at the underside 18*b* of the circuit board 18 within an area corresponding to the arrangement area of the reinforcing plate 20.

The lower end of the second vertical path portion 36*b* is connected to the wiring path 38 of the probe board 22 through the electric coupler 24. The probe board 22 where this wiring path 38 is provided is, in the example shown in FIG. 2, a substantially circular base plate having a larger outer diameter of the reinforcing plate 20 and a smaller outer diameter than the outer diameter of the circuit board 18. It is possible to use a rectangular base plate for the circuit board 18, but in any case, the probe board 22 does not exceed the outer edge of the circuit board 18.

One end of each wiring path 36 of the circuit board 18 terminates at one connecting end portion 40*a* provided on the upside 22*a* of the probe board 22. The other end of each wiring path 38 terminates at the other connecting end portion 40*b* provided on the underside 22*b* of the probe board 22. The one connecting end portion 40*a* is disposed opposite to the lower end of the corresponding second vertical path portion 36*b*. Therefore, the arrangement area of the one connecting end portion 40*a* substantially coincides with the arrangement area of the second vertical path portion 36*b* and lies within an area corresponding to the arrangement area of the reinforcing plate 20. On the other hand, the arrangement area of the other connecting end portion 40*b* substantially exceeds the area corresponding to the arrangement area of the reinforcing plate 20.

The electric coupler 24 disposed between the circuit board 18 and the probe board 22 is, in the example shown in FIG. 2, a heretofore well known pogo pin connector. The pogo pin connector 24 has a pogo pin block 24*a* to be inserted between the circuit board 18 and the probe board 22, and a plurality of pogo pins 24*b* to be assembled into the pogo pin block. Each pogo pin 24*b* electrically connects the lower end of the second vertical path portion 36*b* provided on the circuit board 18 and one connecting end portion 40*a* provided on the probe board 22 corresponding to the lower end.

By this, each probe 26 of the probe board 22 is connected to the socket 34 through the pogo pin 24*b* of the electric coupler 24 and the wiring path 36 of the circuit board 18, and is thus connected to the electric circuit of the tester body through the electrical wire to be connected to the socket. Consequently, by connecting the tip 26*a* of each probe 26 to the corresponding connection pad of the semiconductor wafer 14, an electrical inspection of the IC circuit incorporated into the semiconductor wafer 14 can be conducted.

Figure 3:
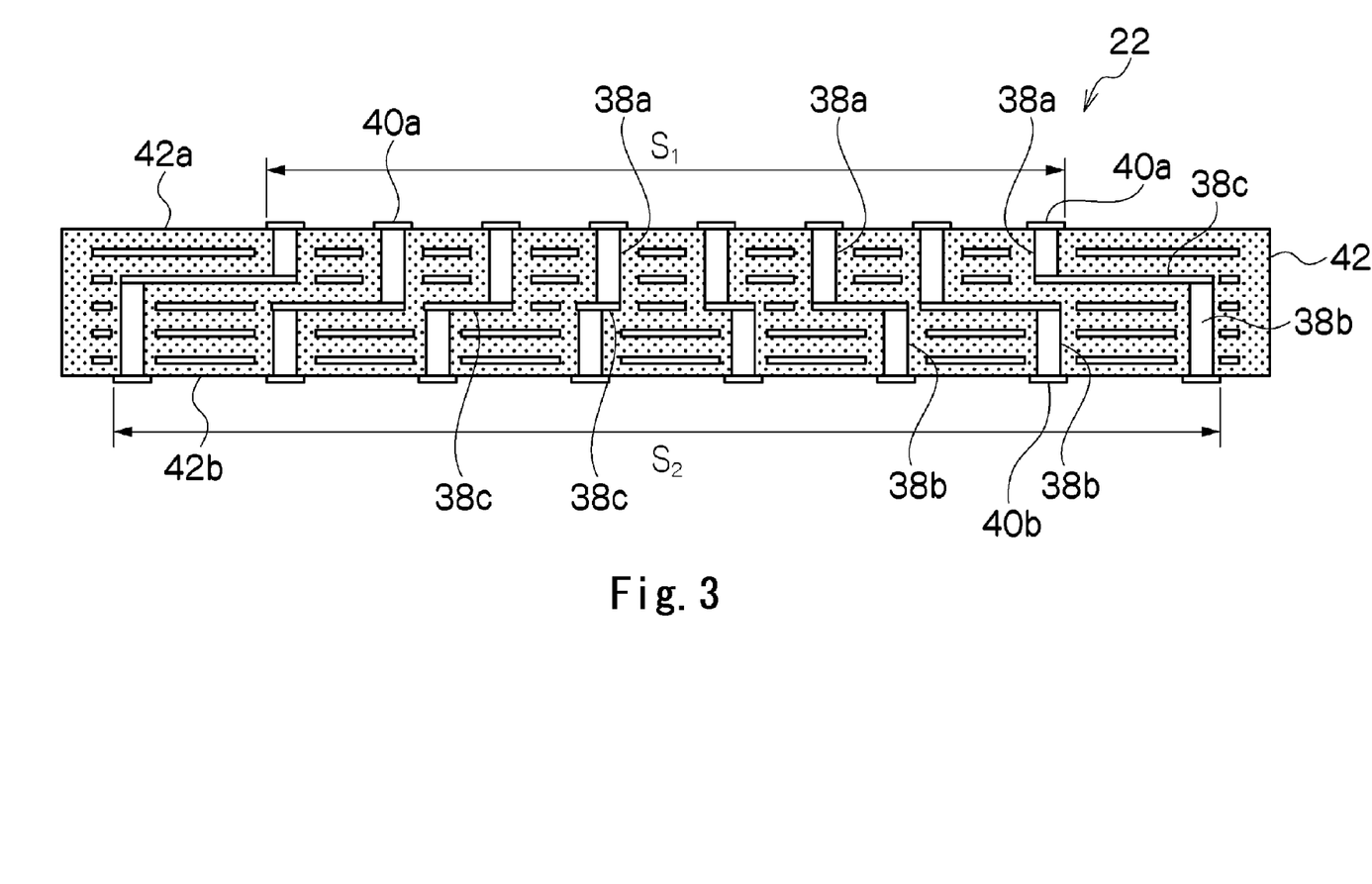
FIG. 3 is an enlarged section of an example of the probe board shown in FIG. 2.

In FIG. 3 is shown a concrete example of the probe board 22 in section. In the example shown in FIG. 3, the probe board 22 is formed by a flat ceramic plate 42 having an upside 42*a* opposing the circuit board 18 and an underside 42*b* to which probes 26 are attached. The upside 42*a* of the ceramic board 42 constitutes the upside 22*a* of the probe board 22, and the underside 42*b* constitutes the underside 22*b* of the probe board 22. In the ceramic board 42 are formed the first and second vertical path portions 38*a* and 38*b* as well as the lateral path portion 38*c* connecting both vertical path portions, all of which constitute the wiring path 38.

The first and second vertical path portions 38*a* and 38*b* respectively extend from the upside 42*a* and underside 42*b* of the ceramic plate 42 to the inside in the thickness direction of the ceramic plate 42. However, besides the connection through the lateral path portion 38*c* of both corresponding vertical path portions 38*a* and 38*b*, the first and second vertical path portions 38*a* and 38*b*, without contacting each other, are spaced apart from each other. Also, the lateral path portion 38*c* is formed in multiple layers within the ceramic plate 42 and, without contacting the non-corresponding first and second vertical portions 38*a* and 38*b*, connect the corresponding first and second vertical portions 38*a* and 38*b*, as mentioned above.

The upper end of the first vertical path portion 38*a* constitutes the one connecting end portion 40*a*. Consequently, the arrangement area S1 of the one connecting end portions 40*a*, that is, the area S1 where the connecting end portions 40*a* are dispersed, lies in an area corresponding to the arrangement area of the reinforcing plate 20 and is smaller in the example shown in FIG. 2. On the other hand, the lower end of the second vertical path portion 38*b* constitutes the other connecting end portion 40*b*. An arrangement area S2 of the other connecting end portion 40*b*, that is, the area S2 where the connecting end portions 40*b* are dispersed, is wider than the arrangement area S1 of the connecting end portions 40*a*. Thus, the arrangement density of the connecting end portions 40*a* within the arrangement area S1 of the one connecting end portions 40*a* is higher than the arrangement density of the connecting end portions 40*b* within the arrangement area S2 of the other connecting end portions 40*b*. Moreover, in the example shown in FIG. 2, the arrangement area S2 of the other connecting end portions 40*b* is wider than the area corresponding to the arrangement area of the reinforcing plate 20 and slightly surpass it. To each connecting end portion 40*b* of the arrangement area S2 is adhered the corresponding probe 26.

Consequently, the first vertical path portion 38*a*, second vertical portion 38*b* and lateral path portion 38*c* form a wiring path 38 which is formed to be divergent from the arrangement area S1 generally formed on the ceramic plate 42, that is, the upside 22*a* of the probe board 22 toward the arrangement area S2 on the underside 22*b*.

Figure 4:
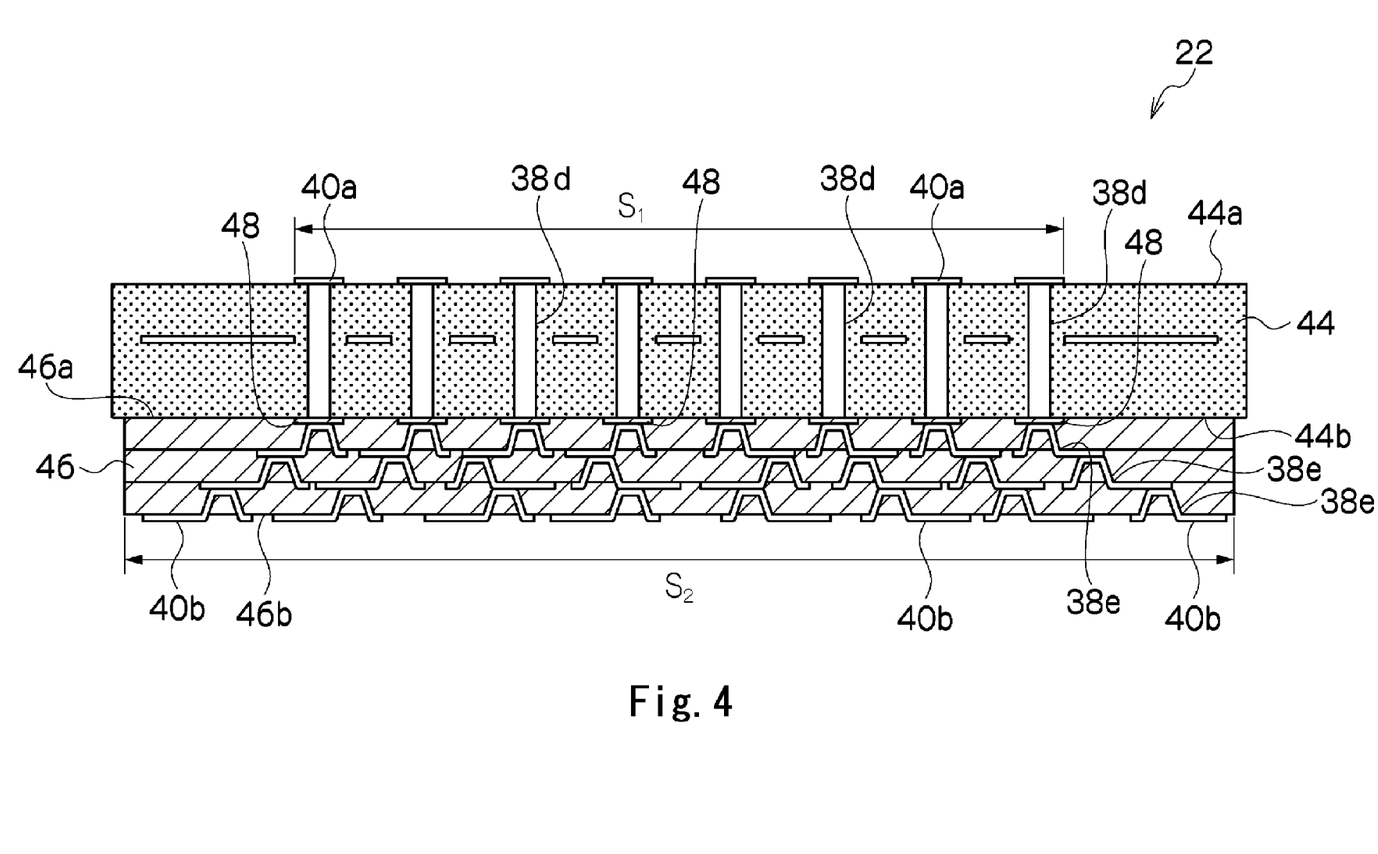
FIG. 4 is a view similar to FIG. 3 showing another example of the probe board shown in FIG. 2

The probe board 22 shown in FIG. 4 has a ceramic plate 44 to be disposed opposite to the circuit board 18 and a flexible insulating plate 46 adhered to the ceramic plate. The upside 44a of the ceramic plate 44 is disposed opposite to the underside 18b of the circuit board 18, thereby constituting the upside 22a of the probe board 22 opposing the circuit board 18. In the ceramic plate 44 is formed an conductive path made of plural vertical path portions 38d in the thickness direction. The upper end of each vertical path portion 38d constitutes the one connecting end portion 40a. Also, the underside of the wiring path 38d forms a connecting portion 48 on the underside 44b of the ceramic plate 44.

In the insulating plate 46 joined to the underside 44b of the ceramic plate 44 are formed conductive paths made of multi-layered conductive path portions 38e arranged to spread stepwise from the inner central portion of the insulating plate to the outside. The conductive path portion 38e of the uppermost layer is connected to the corresponding connecting portion 48 of the ceramic plate on the upside 46a of the insulating plate 46. Also, the conductive path portion 38e of the lowermost layer is exposed to the underside 46b of the ceramic plate 46. The underside 46b of the insulating plate 46 forms the underside 22b of the probe board 22, so that each conductive path portion 38e of the lowermost layer constitutes the other connecting end portion 40b of the probe board 22. To each connecting end portion 40b formed by this conductive path portion 38e is adhered the probe 26 corresponding thereto.

Consequently, the conductive path made of the vertical path portion 38d and the conductive portion 38e forms, as in the example shown in FIG. 3, the wiring path 38 divergent from the arrangement area S1 formed on the upside 22a of the probe board 22 toward the arrangement area S2 formed on the underside 22b.

In the electrical connecting apparatus 10 according to the present invention, the wiring path 36 of the circuit board 18 includes: the first vertical path portion 36a penetrating the circuit board 18 at its outer edge in its thickness direction and connected to the connector 34 on its one surface 18a; the second vertical path portion 36b connected to the electric coupler 24 on the other surface 18b; and the lateral path portion 36c connecting both vertical path portions 36a and 36b. The second vertical path portion 36b is formed within the arrangement area (S1) of the reinforcing plate 18 regardless of upsizing of the probe board 22. Because of this, one connecting end portions 40a of the probe board 22 are disposed within the arrangement area (S1) of the reinforcing plate 18. On the other hand, the other connecting end portions 40b of the probe board 22 are disposed in a dispersed state in the arrangement area (S2) wider than the arrangement area (S1) of the reinforcing plate 18.

Thus, the wiring path 38 of the probe board 22 is formed to spread from the connecting end portion 40a toward the electric coupler 24 to the other connecting end portion 40b to which the probe 26 is to be connected. Therefore, even if upsizing of the probe board 22 is intended, the second vertical path portion 36b of the circuit board 18 can be prevented from exposing to the arrangement area (S) of the connector 34.

Consequently, according to the electrical connecting apparatus 10 of the present invention, even when the probe area sticks out to an outward area of the reinforcing plate 20 due to upsizing of the probe board 22, it is possible to ensure sufficiently a connection area to the tester on one surface 18a of the circuit board 18. Also, even by enlargement of the probe board 22 due to enlargement of the semiconductor wafer 12, it is possible to adapt without incurring a change in the size and arrangement of the connector 34 to be a connecting portion to the tester.

The present invention is not limited to the above embodiments and can be varied without departing from its purport. For instance, as an electric coupler, not only a pogo pin assembly but also another electric coupler such as a wire connector can be employed. Also, while the present invention was explained about an example where the probe board is larger than the reinforcing plate in the above, it is possible to apply the present invention to an electrical connecting apparatus in which the probe board has substantially the same size as or a smaller size than the reinforcing plate.

What is claimed is:

1. An electrical connecting apparatus comprising:
   a circuit board inside of which wiring paths are provided, on one surface of which a reinforcing plate is provided, and at an outer edge portion of which connectors for removably connecting electrical wires from testers to the corresponding wiring paths are provided, the outer edge portion being exposed from said reinforcing plate;
   an electric coupler arranged on the other surface of said circuit board;
   a probe board disposed with its one surface opposed to said electric coupler and provided with wiring paths corresponding to the wiring paths of said circuit board; and
   a plurality of probes provided on the other surface of said probe board;
   wherein each wiring path of said circuit board has:
      a first vertical path portion penetrating said circuit board at the outer edge portion in its thickness direction and connected to said connector on the one surface of said circuit board;
      a second vertical portion penetrating said circuit board in its thickness direction and connected to said electric coupler on the other surface of said circuit board; and
      a lateral path portion connecting both said vertical path portions;
   wherein each wiring path of said probe board is connected to the corresponding second vertical path portion of said wiring path of said circuit board through said electric coupler at one connecting end portion provided on the one surface of said probe board and connected to the corresponding probe at the other connecting end portion provided on the other surface of said probe board;
   wherein said second vertical path portion exists within an area corresponding to an arrangement area of said reinforcing plate, and an arrangement area of the other connecting end portion of the wiring path of said probe board is wider than that of said one connecting end portion of said wiring path of said probe board;
   wherein the planar shape of said probe board is larger than that of said reinforcing plate, the arrangement area of said probe board sticking outward over the arrangement area of said reinforcing plate; and
   wherein the arrangement area of the one connecting end portion of the wiring path of said probe board is within the arrangement area corresponding to the arrangement area of said reinforcing plate.

2. The electrical connecting apparatus claimed in claim 1, wherein said reinforcing plate has a generally circular planar shape.

3. The electrical connecting apparatus claimed in claim 1, wherein said electric coupler is a pogo pin connector having a plurality of pogo pins and a pogo pin block accommodating said pogo pins so that their both ends can project.

4. The electrical connecting apparatus claimed in claim 1, wherein the arrangement area of the other connecting end portion of the wiring path of said probe board sticks outward over the arrangement area of said reinforcing plate.

5. The electrical connecting apparatus claimed in claim 4, wherein the arrangement density of the one connecting end portion of said probe board in said arrangement area is higher than the arrangement density in the arrangement area of the other connecting end portion of said probe board.

6. The electrical connecting apparatus claimed in claim 1, wherein said probe board has a ceramic plate inside of which are provided:
   a first vertical path portion forming the first connecting end portion to said electric coupler disposed within an area corresponding to the arrangement area of said reinforcing plate opposing said electric coupler of said ceramic plate;
   a second vertical path portion forming said second connecting end portion to said probe disposed on the other surface within an area sticking out of an area corresponding to the arrangement area of said reinforcing plate; and
   a lateral path portion connecting both said first and second vertical path portions.

7. The electrical connecting apparatus claimed in claim 1, wherein said probe board has a ceramic plate inside of which conductive paths are formed and an insulating plate inside of which a conductive paths are formed;
   wherein the conductive paths of said insulating plate have connecting portions provided to correspond to said vertical path portions of said ceramic plate on one surface corresponding to said ceramic plate;
   a connecting portion disposed to expose within an area corresponding to the arrangement area of said reinforcing plate on the surface facing said electric coupler;
   a connecting portion disposed within an area sticking out of the arrangement area of said reinforcing plate on the other surface of said insulating plate and to which said probe is connected; and
   a coupler for coupling both said connecting portions within said insulating plate.

8. An electrical connecting apparatus comprising:
   a circuit board having an upper surface, a lower surface, an outer edge portion, and wiring paths provided therein;
   a reinforcing plate provided on the upper surface of the circuit board and sized such that the outer edge portion of the circuit board extends beyond the reinforcing plate;
   connectors at the outer edge portion and on the upper surface of the circuit board, the connectors for removably connecting electrical wires from testers to the wiring paths of the circuit board;
   an electric coupler arranged on the lower surface of the circuit board;
   a probe board having an upper surface, a lower surface, and wiring paths corresponding to the wiring paths of the circuit board, the probe board disposed with its upper surface opposed to the electric coupler; and
   a plurality of probes provided on the lower surface of the probe board;
   wherein each wiring path of the circuit board comprises:
      a first vertical path portion penetrating the circuit board at its outer edge portion in its thickness direction and connected to a respective one of the connectors on the upper surface of the circuit board;
      a second vertical portion penetrating the circuit board in its thickness direction and connected to the electric coupler on the lower surface of the circuit board; and
      a lateral path portion connecting the first vertical path portion to the second vertical path portion;
   wherein each wiring path of the probe board has an upper connecting end portion provided on the upper surface of the probe board, and a lower connecting end portion provided on the lower surface of the probe board, the upper connecting end portion connected to a corresponding second vertical path portion through the electric coupler, and the lower connecting end portion connected to a corresponding probe;
   wherein the circuit board has an arrangement area defined by its second vertical path portions, and the reinforcing plate overlaps the arrangement area;
   wherein the upper connecting end portions of the probe board define an upper probe arrangement area, the lower connecting end portions of the probe board define a lower probe arrangement area, and the lower probe arrangement area is wider than the upper probe arrangement area;
   wherein the planar shape of the probe board is larger than that of the reinforcing plate, the lower probe arrangement area protruding outward beyond the arrangement area of the circuit board; and
   wherein the upper probe arrangement area is within the arrangement area of the circuit board.

* * * * *